(12) United States Patent
Chen et al.

(10) Patent No.: US 9,448,012 B2
(45) Date of Patent: Sep. 20, 2016

(54) MAKING METHOD FOR COOLING BODY, COOLING BODY AND LIGHTING DEVICE COMPRISING THE COOLING BODY

(75) Inventors: Xiaomian Chen, Guangdong (CN); Xi Huang, Guangdong (CN); Hao Li, Guangdong (CN); Shang Ping Xiao, Guangdong (CN)

(73) Assignee: OSRAM GMBH, Munich (DE)

( * ) Notice: Subject to any disclaimer, the term of this patent is extended or adjusted under 35 U.S.C. 154(b) by 575 days.

(21) Appl. No.: 13/820,536

(22) PCT Filed: Aug. 30, 2011

(86) PCT No.: PCT/EP2011/064903
§ 371 (c)(1),
(2), (4) Date: Mar. 4, 2013

(87) PCT Pub. No.: WO2012/031943
PCT Pub. Date: Mar. 15, 2012

(65) Prior Publication Data
US 2013/0160980 A1 Jun. 27, 2013

(30) Foreign Application Priority Data

Sep. 10, 2010 (CN) .......................... 2010 1 0281127

(51) Int. Cl.
*F21V 29/74* (2015.01)
*F21V 29/76* (2015.01)
(Continued)

(52) U.S. Cl.
CPC .................. *F28F 1/40* (2013.01); *B23P 15/26* (2013.01); *F21V 29/773* (2015.01); *F21V 29/86* (2015.01);
(Continued)

(58) Field of Classification Search
CPC ............ H01L 23/3731; H01L 23/3677; H01L 23/3672; H05K 7/20154; H05K 7/20127; F21V 29/2212; F21V 29/74; F21V 29/76; F21V 29/86
USPC ....... 165/80.3, 185; 362/218, 294, 345, 373; 361/704, 710, 703
See application file for complete search history.

(56) References Cited

U.S. PATENT DOCUMENTS 6,520,248 B2 * 2/2003 Gailus ................. H01L 21/4882
165/185
6,749,009 B2 * 6/2004 Barten .................... F28F 3/025
165/131

(Continued)

FOREIGN PATENT DOCUMENTS

CN 101144592 A 3/2008
CN 201741694 U * 2/2011
(Continued)

OTHER PUBLICATIONS

English abstract of CN 101144592 A of Mar. 19, 2008.
(Continued)

*Primary Examiner* — Allen Flanigan
*Assistant Examiner* — For K Ling

(57) ABSTRACT

A method for making a cooling body for a lighting device may include: a) Providing multiple aluminum nitride ceramic radiators; b) Putting the multiple aluminum nitride ceramic radiators into a mold; c) Closing the mold, and injecting a melting metal into the mold so that the metal encloses a portion of each of the aluminum nitride ceramic radiators, wherein the metal has a melting point lower than that of the aluminum nitride ceramic radiators; and d) Opening the mold, and obtaining the cooling body.

6 Claims, 5 Drawing Sheets

(51) Int. Cl.
*F28F 1/40* (2006.01)
*B23P 15/26* (2006.01)
*H01L 21/48* (2006.01)
*F21V 29/77* (2015.01)
*F21V 29/85* (2015.01)
*F21V 29/89* (2015.01)
*F21Y 101/02* (2006.01)
*H01L 23/367* (2006.01)
*H01L 23/373* (2006.01)

(52) U.S. Cl.
CPC ........... F21V 29/89 (2015.01); H01L 21/4882 (2013.01); *F21Y 2101/02* (2013.01); *H01L 23/3672* (2013.01); *H01L 23/3677* (2013.01); *H01L 23/3731* (2013.01); *H01L 2924/0002* (2013.01); *Y10T 29/4935* (2015.01)

(56) References Cited

U.S. PATENT DOCUMENTS

| | | | | |
|---|---|---|---|---|
| 6,758,263 | B2* | 7/2004 | Krassowski | F28F 13/00 165/185 |
| 6,765,794 | B1* | 7/2004 | Inoue | H01L 23/427 165/80.3 |
| 7,428,154 | B2* | 9/2008 | Ishimine | H01L 23/4006 165/185 |
| 7,497,013 | B2* | 3/2009 | Zaghlol | H01L 21/4882 165/185 |
| 7,553,047 | B2* | 6/2009 | Shin | F21K 9/00 361/720 |
| 7,651,247 | B2* | 1/2010 | Kuan | F21V 29/004 362/294 |
| 8,087,456 | B2* | 1/2012 | Wei | B23P 15/26 165/185 |
| 8,246,219 | B2* | 8/2012 | Teng | F21K 9/00 362/217.02 |
| 2007/0017652 | A1* | 1/2007 | Osanai | B22D 19/00 164/461 |
| 2007/0070629 | A1* | 3/2007 | Hulick | F21V 29/80 362/294 |
| 2007/0227685 | A1* | 10/2007 | Sugawara | B22D 19/00 164/98 |
| 2009/0139690 | A1* | 6/2009 | Maerz | H01L 23/367 165/80.2 |
| 2009/0303685 | A1* | 12/2009 | Chen | F21V 29/85 361/710 |
| 2010/0110636 | A1* | 5/2010 | Chou | F21V 29/004 361/702 |
| 2014/0016330 | A1* | 1/2014 | Dohn | H01L 23/3677 362/373 |

FOREIGN PATENT DOCUMENTS

| | | | |
|---|---|---|---|
| CN | 202221659 U | * | 5/2012 |
| EP | 1400500 A1 | | 3/2004 |
| EP | 2081220 A2 | | 7/2009 |

OTHER PUBLICATIONS

Office Action issued in the corresponding Chinese application No. 201010281127.7, dated Jul. 3, 2014 (with translation).

* cited by examiner

MAKING METHOD FOR COOLING BODY, COOLING BODY AND LIGHTING DEVICE COMPRISING THE COOLING BODY

RELATED APPLICATIONS

The present application is a national stage entry according to 35 U.S.C. §371 of PCT application No.: PCT/EP2011/064903 filed on Aug. 30, 2011, which claims priority from Chinese application No.: 201010281127.7 filed on Sep. 10, 2010.

TECHNICAL FIELD

The present invention relates to a method for making a cooling body for a lighting device. In addition, the present invention also relates to a cooling body made using the above method and a lighting device comprising the cooling body.

BACKGROUND ART

In thermal management systems of current high-power LED products, a passive cooling device is the most commonly used means. In this type of thermal management systems, the following performances of a cooling body of the passive cooling device will affect it: heat dissipation including a surface emissivity and convection ability; and thermal conductivity (coefficient of thermal conductivity).

A known cooling body for a cooling device is made from an aluminum alloy-384 by die casting. In the consideration of anti-corrosion and beauty, usually surface treatment will be performed for the cooling body, for example, coating paint. The cooling body has an advantage of high surface emissivity, for example, it is about 0.92-0.96 in the case that paint is coated. However, the thickness of the surface layer is large and the coefficient of thermal conductivity is also low, for example, in the case that paint is coated, the thickness is about 0.2-0.8 mm and the coefficient of thermal conductivity is less than 1 W/m*k. Meanwhile, due to the material characteristics of the aluminum alloy-384, the coefficient of thermal conductivity is not high, being about 92 W/m*k.

In the prior art, the cooling body of the cooling device is usually made from the aluminum alloy-6063 by an extrusion molding process. After the extrusion molding process, its surface should be subjected to oxidization treatment to form a layer of thin oxidization film which is about 0.02 mm.

The oxidization film has a middle coefficient of thermal conductivity being about 46 W/m*k. However, due to the material characteristics of the oxidization film, its surface emissivity is low being about 0.20.

In addition, the prior art also discloses a cooling body made from an aluminum nitride material, and the surface treatment to the cooling body made from the aluminum nitride material is only to clean the surface. The surface of the cooling body is a normal aluminum nitride ceramic surface and has no any additional material. The cleaned surface has no any coating. Therefore, the overall cooling body has the same high coefficient of thermal conductivity, being about 180 W/m*k. Meanwhile, the surface emissivity of the cooling body is also high, being about 0.93. However, its disadvantages are also obvious, that is, the material cost is high and the making thereof is difficult.

SUMMARY

Various embodiments provide an improved cooling body whose thermal performances, i.e., surface emissivity, coefficient of thermal conductivity and convection ability, are fine, and its making cost and difficulty are relatively low.

Various embodiments provide a method for making a cooling body for a lighting device, including: a) providing multiple aluminum nitride ceramic radiators; b) putting the multiple aluminum nitride ceramic radiators into a mold; c) closing the mold, and injecting a melting metal into the mold so that the metal encloses a portion of each of the aluminum nitride ceramic radiators, wherein the metal has a melting point lower than that of the aluminum nitride ceramic radiators; and d) opening the mold, and obtaining the cooling body. In the method according to various embodiments, the radiators are made from aluminum nitrogen ceramic which has very good thermal performances, i.e., a high surface emissivity of about 0.93 and a large coefficient of thermal conductivity of about 180 W/m*k. On the other hand, as the heat conductor per se is made from a metal, such as copper or aluminum alloy, which has a melting point lower than that of the aluminum nitrogen ceramic radiators, the making cost of the overall cooling body is lowered as a whole, and fine thermal performances are also achieved.

In a preferable design of the present invention, in step a) multiple fin-shape aluminum nitride ceramic radiators are provided, in step b) the multiple fin-shape aluminum nitride ceramic radiators are arranged in the mold in a radial form, and in step c) the melting metal is injected into a portion of or all of a central region surrounded by the multiple fin-shape aluminum nitride ceramic radiators to form a cylinder or a ring bearing the multiple aluminum nitride ceramic radiators; or the melting metal is injected into bottom ends of the multiple fin-shape aluminum nitride ceramic radiators to form a bottom plate bearing the multiple aluminum nitride ceramic radiators. Thus, a cylindrical or circular heat conductor is formed, and on the surface of its outer circumference multiple radiation fins extending outward in a radial form are formed, or a bottom plate-shape heat conducting plate can be formed, and the multiple radiation fins extending outward in a radial form are erected at the heat conducting plate using one end face thereof. The heat conductor with this structure has as large a contact area as possible with ambient environment, thereby obtaining fine convection ability, which more helps heat dissipation.

As put forward in another preferable design of the present invention, in step a) multiple columnar aluminum nitride ceramic radiators are provided, in step b) the multiple fin-shape or columnar aluminum nitride ceramic radiators are arranged in parallel in the mold, and in step c) the melting metal is injected into bottom ends of the multiple fin-shape or columnar aluminum nitride ceramic radiators to form a bottom plate bearing the multiple aluminum nitride ceramic radiators. With this method a traditional type of cooling bodies can be obtained, and this type of radiators have been proved to better dissipate heat.

As put forward in still another preferable design of the present invention, in step a) multiple fin-shape aluminum nitride ceramic radiators with a center bore are provided. In step b) the multiple fin-shape aluminum nitride ceramic radiators with a center bore are arranged in parallel in the mold. In step c) the melting metal is injected into respective center bores of the multiple fin-shape aluminum nitride ceramic radiators to form an elongated rod bearing the multiple fin-shape aluminum nitride ceramic radiators. With this method a cooling body having a novel structure is obtained, and has better convection ability.

Another object of the present invention is realized via a cooling body for a lighting device, and the cooling body consists of a heat conductor and multiple radiators, wherein, a portion of each of the multiple radiators is enclosed into the heat conductor, and the heat conductor is made of a metal and the radiators are made from aluminum nitride ceramic, wherein, the melting point of the heat conductor is lower than that of the aluminum nitride ceramic. As the radiators are made from aluminum nitrogen ceramic which per se has very good thermal performances, i.e., a high surface emissivity of about 0.93 and a large coefficient of thermal conductivity of about 180 W/m*k. On the other hand, as the heat conductor per se is made from a metal, such as copper or aluminum alloy, which has a melting point lower than that of the aluminum nitrogen ceramic radiators, the making cost of the overall cooling body is lowered as a whole, and fine thermal performances are also achieved.

In a preferable design of the present invention, the heat conductor is designed to be cylindrical or circular, and the radiators are designed to be in a fin-shape, and the radiators are provided at the circumference of the heat conductor in a radial form. Thus, a cylindrical or circular heat conductor can be formed, and on the surface of its outer circumference multiple radiation fins extending outward in a radial form are formed.

In another preferable design of the present invention, the heat conductor is designed to be a flat bottom plate and the radiators are designed to be columnar or be in a fin-shape, and the radiators are erected at the heat conductor.

The above two structures of cooling bodies have fine convection ability and heat conducting performance.

According to still another design of the present invention, the heat conductor is designed to be an elongated rod and the radiators are designed to be fin-shape radiators having a center bore, and the heat conductor penetrates the center bores of the multiple radiators to bear the multiple radiators. This structure of cooling body has better convection ability.

Various embodiments provide a lighting device including the above cooling body. The cooling body according to various embodiments can better dissipate heat for the lighting device, and also, the cooling body has a low making cost, which also lowers the making cost of the lighting device.

It should be understood that the above general description and the following detailed description are for listing and explanation, and aim to provide further explanation of the claimed invention.

BRIEF DESCRIPTION OF THE DRAWINGS

The accompanying drawings constitute a part of the Description and are used to provide further understanding of the present invention. Such accompanying drawings illustrate the embodiments of the present invention and are used to describe the principles of the present invention together with the Description. In the accompanying drawings the same components are represented using the same reference. As shown in the drawings.

DETAILED DESCRIPTION OF THE EMBODIMENTS

Figure 1:
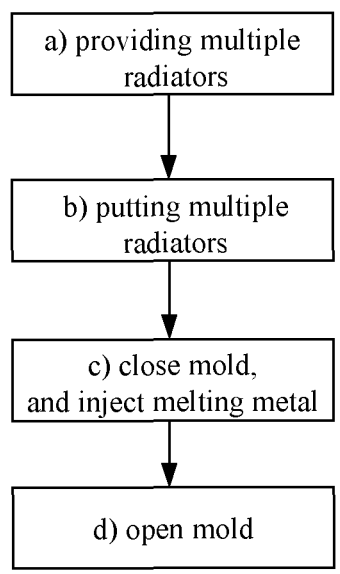
FIG. 1 is flow chart of the method according to the present invention.

FIG. 1 illustrates the method for making the cooling body 1 according to the present invention. In step a of the method multiple aluminum nitride ceramic radiators 2 are provided; in step b the multiple aluminum nitride ceramic radiators 2 are put into a mold; in step c a melting metal is injected into the mold so that the metal encloses a portion of each of the aluminum nitride ceramic radiators 2, as the metal has a melting point lower than that of the aluminum nitride ceramic radiators, the melting metal will not melt the aluminum nitrogen ceramic radiators, and in the design of the present invention, the metal is aluminum alloy having a melting point within the range from about 516 to 654° C., and the melting point of the aluminum nitrogen ceramic radiators is 2227° C.

Figure 2:
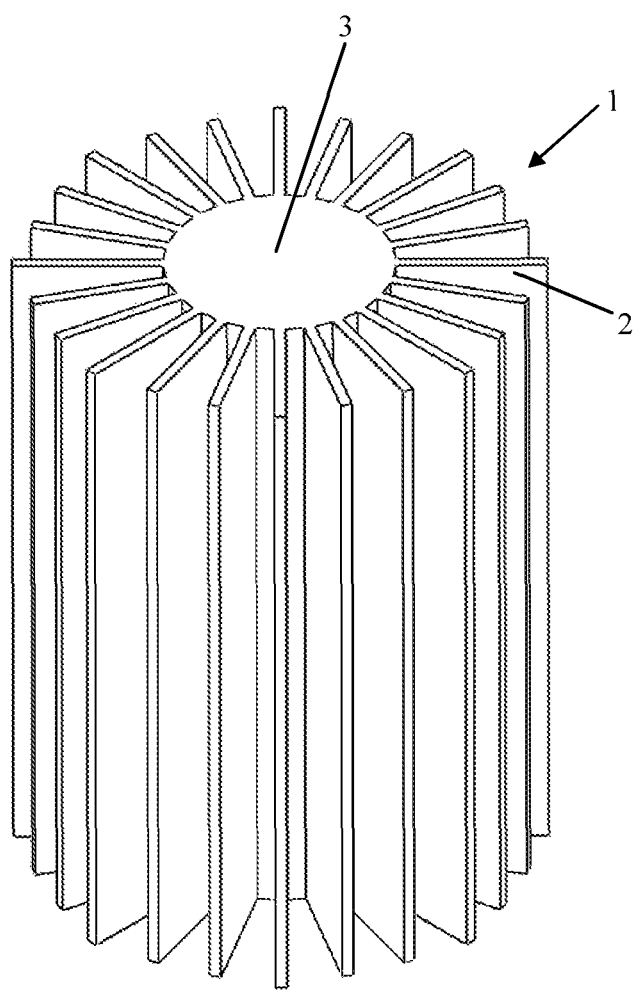
FIG. 2 is a schematic view of the cooling body according to the present invention.

FIG. 2 is a schematic view of the cooling body according to the present invention. Seen in the figure, the cooling body 1 consists of multiple radiators 2 and a heat conductor 3, wherein the heat conductor 3 is used to deliver the heat from a heating device such as LED to the radiators 2 which then deliver the heat to ambient environment. In this design, the heat conductor 3 is made of a meltable metal such as aluminum alloy, and the radiators 2 are made from aluminum nitrogen ceramic.

Figure 3A:
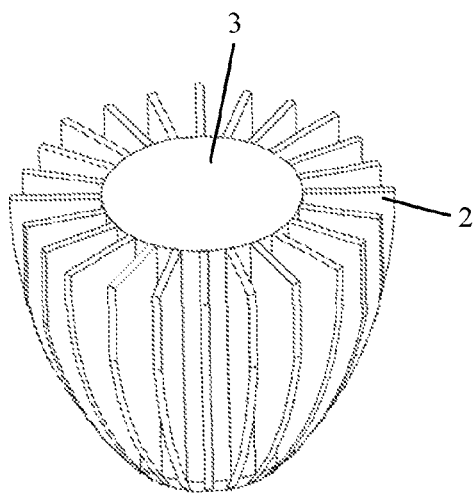
FIGS. 3a-3c illustrates a schematic view of the first embodiment of the cooling body according to the present invention.
Figure 3B:
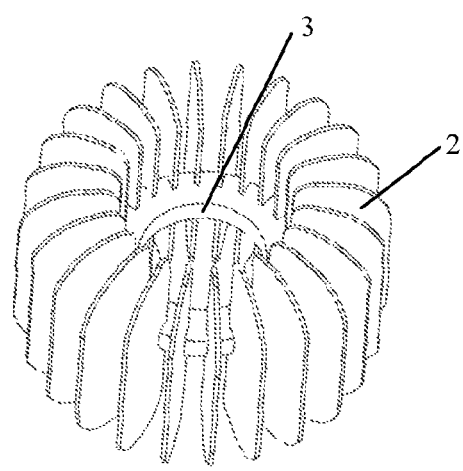
Figure 3C:
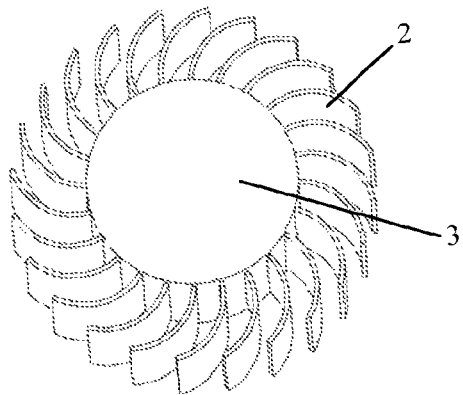

FIGS. 3a-3c illustrates a schematic view of the first embodiment of the cooling body according to the present invention. In this embodiment, the heat conductor 3 is designed to be cylindrical or circular, and multiple radiators 2 are arranged on the circumference of the heat conductor 3 in a radial form, wherein the radiators 2 can be designed to be planar radiation fins in a square, a rectangle or other irregular forms or designed to be radiation fins with a curved surface. The difference between FIG. 3a and FIG. 3b only lies in that the heat conductor 3 is designed to be circular, while the difference between FIG. 3c and FIG. 3a only lies in that the radiators 2 are designed to have a curved surface.

Figure 4A:
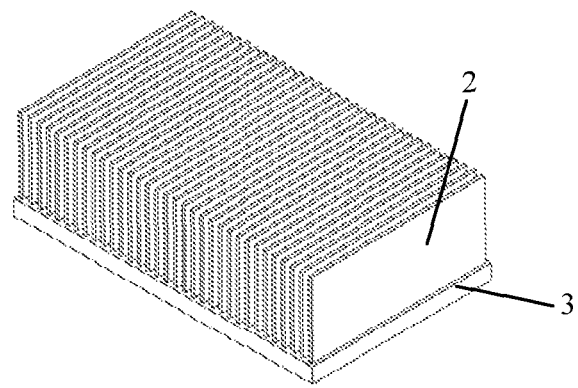
FIGS. 4a-4c illustrates a schematic view of the second embodiment of the cooling body according to the present invention.
Figure 4B:
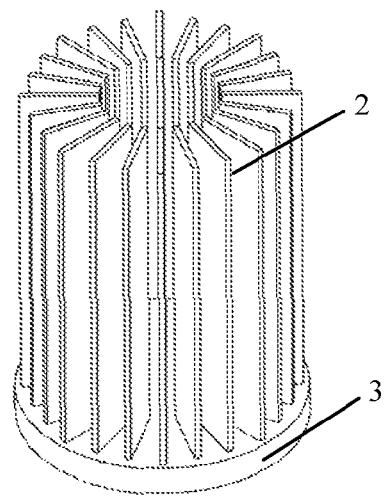
Figure 4C:
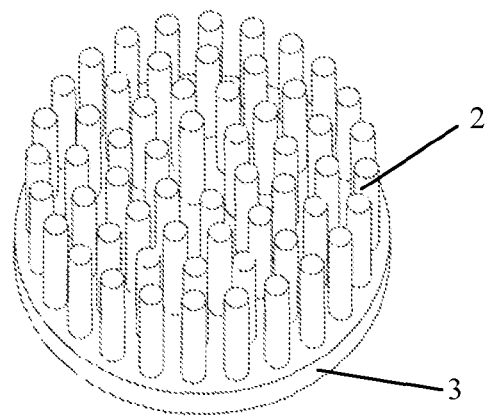

FIGS. 4a-4c illustrates a schematic view of the second embodiment of the cooling body according to the present invention. In this embodiment, the heat conductor 3 is designed to be a polygon or a circular bottom plate, and the multiple radiators 2 are erected at the heat conducting plate 3. The heat conductor 3 in FIG. 4a is a rectangular bottom plate and multiple radiators 2 (radiation fins) parallel to each other are erected at the heat conductor 3. The heat conducting plate 3 in FIG. 4b is a circular bottom plate, the multiple radiators 2 (radiation fins) are arranged in a radial form and erected at the heat conducting plate 3. The heat conducting plate 3 in FIG. 4c is a circular bottom plate, and the difference only lies in that the multiple radiators 2 are designed to be columnar and are erected at the heat conducting plate 3 parallel to each other.

Figure 5:
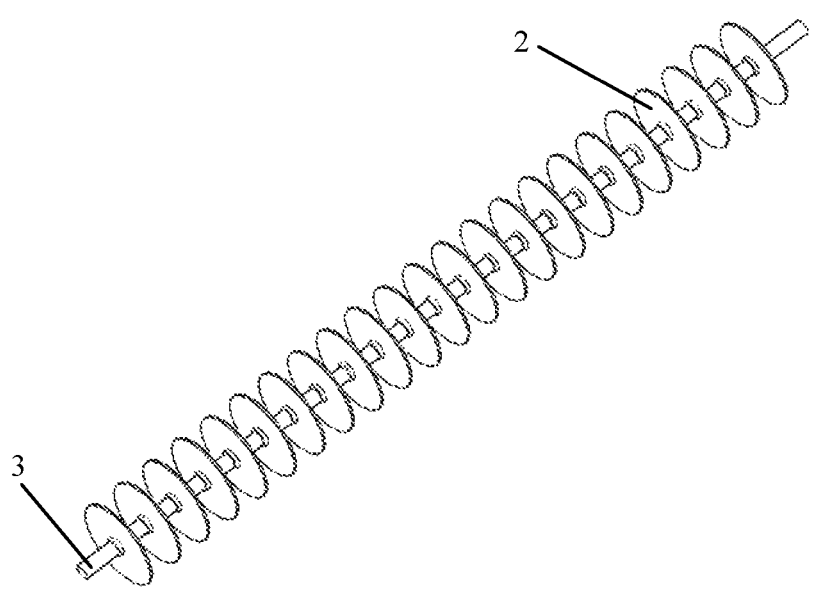
FIG. 5 is a schematic view of the third embodiment of the cooling body according to the present invention.

FIG. 5 is a schematic view of the third embodiment of the cooling body according to the present invention. In this embodiment, the radiators 2 are designed to be circular radiation fins having a center bore. The elongated rod-shape heat conductor 3 penetrates the center holes of the radiation fins 2 and maintains the radiation fins 2 at the heat conductor 3 parallel to each other.

The descriptions above are only preferable embodiments of the present invention and are not used to restrict the present invention. For those skilled in the art, the present invention may have various changes and variations. Any modifications, equivalent substitutions, improvements etc. within the spirit and principle of the present invention shall all be included in the scope of protection of the present invention.

LIST OF REFERENCE SIGNS 1 cooling body
2 radiator
3 heat conductor

The invention claimed is:

1. A cooling body for a lighting device, the cooling body comprising:
   a heat conductor and multiple radiators,
   wherein a portion of each of the multiple radiators is enclosed into the heat conductor, and the heat conductor is made of a metal and the radiators are made exclusively from aluminum nitride ceramic, wherein the melting point of the heat conductor is lower than that of the aluminum nitride ceramic.

2. The cooling body according to claim 1,
   wherein the heat conductor is designed to be cylindrical or circular, and the radiators are designed to be in a fin-shape.

3. The cooling body according to claim 2,
   wherein the radiators are provided at the circumference of the heat conductor in a radial form.

4. The cooling body according to claim 1,
   wherein the heat conductor is designed to be a flat bottom plate and the radiators are designed to be columnar or be in a fin-shape, and the radiators are erected at the heat conductor.

5. The cooling body according to claim 1,
   wherein the heat conductor is designed to be an elongated rod and the radiators are designed to be fin-shape radiators having a center bore, and the heat conductor penetrates the center bores of the radiators.

6. A lighting device, comprising:
   a cooling body, comprising:
   a heat conductor and multiple radiators,
   wherein a portion of each of the multiple radiators is enclosed into the heat conductor, and the heat conductor is made of a metal and the radiators are made exclusively from aluminum nitride ceramic, wherein the melting point of the heat conductor is lower than that of the aluminum nitride ceramic.

* * * * *